(12) United States Patent
Akiyama

(10) Patent No.: US 6,686,916 B2
(45) Date of Patent: Feb. 3, 2004

(54) METHOD OF CREATING REFERENCE DATA TABLE

(75) Inventor: Yutaka Akiyama, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 377 days.

(21) Appl. No.: 09/902,567

(22) Filed: Jul. 12, 2001

(65) Prior Publication Data

US 2002/0007259 A1 Jan. 17, 2002

(30) Foreign Application Priority Data

Jul. 13, 2000 (JP) .................................... 2000-212178

(51) Int. Cl.$^7$ .............................................. G06T 15/30
(52) U.S. Cl. ...................................... 345/423; 345/427
(58) Field of Search ................................ 345/419, 420, 345/421, 423, 427, 426, 582, 619

(56) References Cited

U.S. PATENT DOCUMENTS

| | | | |
|---|---|---|---|
| 5,586,230 A | * 12/1996 | Leon et al. .................. | 345/420 |
| 5,737,250 A | 4/1998 | Sawahata .................... | 364/578 |
| 5,932,881 A | 8/1999 | Sawahata ............... | 250/492.21 |
| 5,977,551 A | 11/1999 | Sawahata ............... | 250/492.21 |
| 6,011,914 A | * 1/2000 | Akiyama ..................... | 703/14 |
| 6,226,005 B1 | * 5/2001 | Laferriere ................... | 345/426 |

FOREIGN PATENT DOCUMENTS

| | | |
|---|---|---|
| JP | 8-115888 | 5/1996 |
| JP | 9-213650 | 8/1997 |
| JP | 10-135145 | 5/1998 |

OTHER PUBLICATIONS

IEEE Transactions On Electron Devices, vol. ED–32, No. 10, Oct. 1985—"Iterative Methods in Semiconductor Device Simulation".

* cited by examiner

Primary Examiner—Matthew Luu
(74) Attorney, Agent, or Firm—Foley & Lardner

(57) ABSTRACT

A method of creating a reference table where polygon elements and rectangular pieces are connected with each other. The processor searches, as first searched rectangular pieces, the rectangular pieces that include the vertexes of the target polygon element, so as to register the element number of the target polygon element for the rows corresponding to the first searched rectangular pieces. Then the processor searches, as second searched rectangular pieces, the rectangular pieces that are traversed by the edges of the target polygon element, so as to register the element number of the target polygon element for the rows corresponding to the second searched rectangular pieces. The processor further registers the element number of the target polygon element for the rows corresponding to the rectangular pieces that exist within the target polygon element, so that the element number of the target polygon element is registered with all of the rectangular pieces overlapping the target polygon element. The processor repeatedly carries out the above-mentioned registration process for all of the polygon element, and thereby, the reference data table is obtained.

12 Claims, 11 Drawing Sheets

REFERENCE DATA TABLE

| | |
|---|---|
| 1 | 1,3 |
| 2 | 1 |
| 3 | 1,2 |
| 4 | 2,3 |
| 5 | 3 |
| 6 | 3,4 |
| ⋮ | ⋮ |
| n-3 | m-5,m-4 |
| n-2 | m-4,m-3,m-1 |
| n-1 | m-2,m-1 |
| n | m-1,m |

↑ No. OF RECTANGULAR PIECE
↑ No. OF POLYGON ELEMENT

REFERENCE DATA TABLE

| | |
|---|---|
| 1 | 1,3 |
| 2 | 1 |
| 3 | 1,2 |
| 4 | 2,3 |
| 5 | 3 |
| 6 | 3,4 |
| ⋮ | ⋮ |
| n-3 | m-5,m-4 |
| n-2 | m-4,m-3,m-1 |
| n-1 | m-2,m-1 |
| n | m-1,m |

↑ No. OF RECTANGULAR PIECE

↑ No. OF POLYGON ELEMENT

FIG.2

METHOD OF CREATING REFERENCE DATA TABLE

BACKGROUND OF THE INVENTION

This invention relates to a method of creating a reference table helpful to high-speed computing, for example, in a fabrication process simulation of a semiconductor device.

In the field of the semiconductor device fabrication process simulation, an object is abstracted into a simulation model for the sake of simple computing. The simulation model is further divided into a plurality of elements, each of which is handled as a target of observation or prediction of the phenomenon occurring at the object.

Such a process simulation technique is disclosed in Japanese Unexamined Patent Publication (JP-A) No. 10-135145, which is incorporated herein by reference. In JP-A No. 10-135145, a simulation object is a two-dimensional object, and elements are triangle elements. In an ion-implantation simulation, the triangle element that an implanted ion reaches is computed.

Generally, all triangle elements are not searching targets in the ion-implantation simulation to prevent a large amount of computing. In spite of this, normal approach uses a plural-rectangular arrangement, for example, an orthogonal mesh arrangement. In advance of a process simulation, a reference data table is created, where rectangular pieces and triangle elements are registered in connection with each other. In the process simulation, a specific rectangular piece is at first selected in correspondence with a location the implanted-ion reaches, then only the triangle elements that are connected with the specific rectangular piece are handled as computing targets, with reference to the pre-created reference data table. Thus to use the reference data table can decrease the number of the triangle elements as the computing targets, and therefore, the reference data table is helpful to lower amount of computing the triangle element the implanted-ion reaches.

For the reference data table to be more efficient, each of rectangular pieces needs to be small in size. Otherwise, the number of the triangle elements that are connected with one rectangular piece becomes large, resulting in large amount of the computation to be required to search the triangle element that an implanted-ion reaches. However, if each rectangular piece is small in size, a large amount of computation is required in previously creation of the reference data table.

In light of the foregoing, there is a need to reduce an amount of computation required for creation of the reference data table even if rectangular piece is small in size.

SUMMARY OF THE INVENTION

This invention therefore provides a method of creating a reference data table which accompanies with a small amount of computation if rectangular piece is small in size.

According to one aspect of this invention, a method of creating a reference data table comprises following steps which are executed by a processor. In advance of the reference data table creation, a two-dimensional rectangular coordinates is configured to cover a two-dimensional object. In addition, the two-dimensional object is divided into a plurality of polygon elements. Each of the polygon elements has vertexes and edges connecting between two vertexes. Also, each of the polygon elements has, as a element number, a unique number added to the polygon element. Furthermore, a two-dimensional orthogonal mesh is produced on the two-dimensional rectangular coordinates. The two-dimensional orthogonal mesh comprises a plurality of rectangular pieces which are regularly arranged on the two-dimensional rectangular coordinates and each of which has, as a piece number, a unique number added to the rectangular piece.

The processor makes an initial data table having two column and a plurality of rows, each of rows at one column storing the piece numbers of the rectangular pieces, respectively. Then the processor carries out a predetermined registration process for each of the polygon element as a target polygon element so that, when the predetermined registration process is repeatedly carried out for all of the polygon element, the reference data table is obtained.

In detail, the predetermined registration process generally comprises three steps. Firstly, the processor searches, as first searched rectangular pieces, the rectangular pieces that include the vertexes of the target polygon element, and then registers the element number of the target polygon element for the rows corresponding to the first searched rectangular pieces. Secondly, the processor searches, as second searched rectangular pieces, the rectangular pieces that are traversed by the edges of the target polygon element, and then registers the element number of the target polygon element for the rows corresponding to the second searched rectangular pieces. Thirdly, the processor registers the element number of the target polygon element for the rows corresponding to the rectangular pieces that exist within the target polygon element. Thus the element number of the target polygon element is registered with all of the rectangular pieces overlapping the target polygon element.

As well known to the inventor, there are similar problems in a simulation using a three-dimensional object. That is, there is a need to reduce an amount of computation required for creation of the reference data table if rectangular block has small volume.

In relation, the above-mentioned method of creating the reference data table can be modified or extended to handle the three-dimensional object. In the simulation using the three-dimensional object, rectangular blocks and polyhedron elements are used in spite of the foregoing rectangular pieces and polygon elements. Also, a three-dimensional orthogonal coordinates is defined in spite of the two-dimensional orthogonal coordinates. It is noted here that, as for the second step of the foregoing predetermined registration process, the extended method uses faces of the target polyhedron in spite of the edges of the target polygon.

BRIEF DESCRIPTION OF THE DRAWINGS

FIG. 2 is an example view of a reference data table according to the first embodiment of this invention;

DESCRIPTION OF THE PREFERRED EMBODIMENTS

Figure 1:
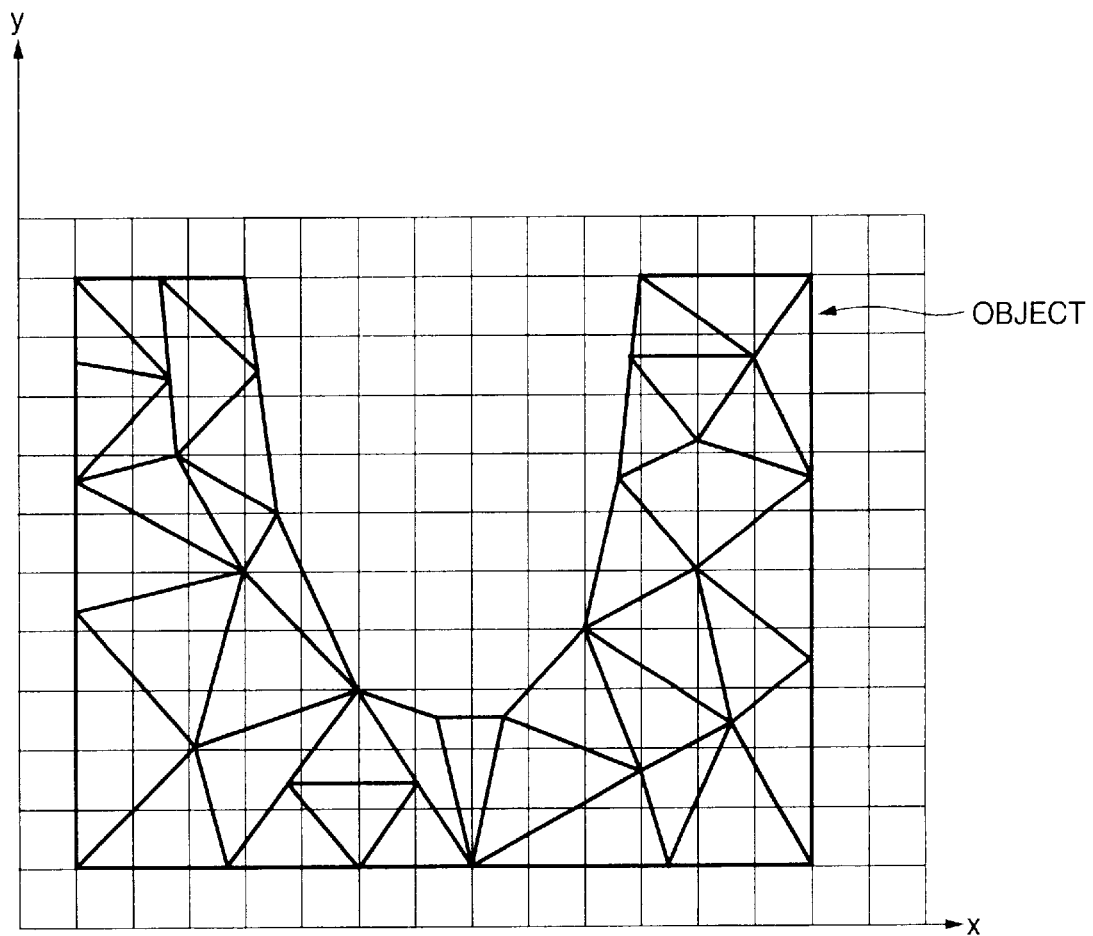
FIG. 1 is a view for use in describing a relationship among an object, polygon elements, an orthogonal mesh comprising rectangular pieces, in accordance with a first embodiment of this invention.

Referring to FIG. 1, an object for a device process simulation is divided into a plurality of polygon elements, while a two-dimensional orthogonal mesh comprising a plurality of rectangular pieces is configured to cover the object. Each of the polygon elements is assigned with a unique number as an element number, while each of the rectangular pieces is assigned with a unique number as a piece number. In a first embodiment of the present invention, each of the illustrated polygon elements has a triangle shape, and each of pieces comprising the orthogonal mesh is square. The pieces are however referred to as rectangular pieces in the following description, that is the term "rectangular" means rectangular and square in this specification.

A method of creating reference data table according to the first embodiment of the present invention provides a reference data table as shown in FIG. 2. The illustrated reference data table is a generic type, but the present invention is not limited to the data structure of the illustrated table.

In the illustrated reference data table, rows correspond to the respective rectangular pieces comprising the orthogonal mesh. The left column stores the piece numbers of the respective rectangular pieces. In this embodiment, to store the piece numbers into the left column is also referred to as "registration of the rectangular pieces for the reference data table." Each row also stores the polygon elements that partially or fully overlap the rectangular piece corresponding to the row. In this embodiment, to store the element numbers of the polygon elements into the right column is also referred to as "registration of the polygon elements for the reference data table". In addition, the registration of the polygon element for the row corresponding to the rectangular piece is also called "registration of the polygon element for the rectangular piece".

Plural polygon elements may be registered with one rectangular piece. If one edge of a polygon traverses a rectangular, another polygon neighboring to the polygon is also registered with the same rectangular because the side is normally shared by the neighboring two polygons. If one vertex of a polygon belongs to a rectangular, two or more other polygons are also registered with the rectangular because the vertex is normally shared by the three or more polygons. If a polygon is fully included in a rectangular, plural polygons surrounding the polygon are also naturally registered with the rectangular. On the other hand, if a rectangular is included in one polygon, that is the polygon is larger than the rectangular, only the polygon is registered with the rectangular.

Figure 3:
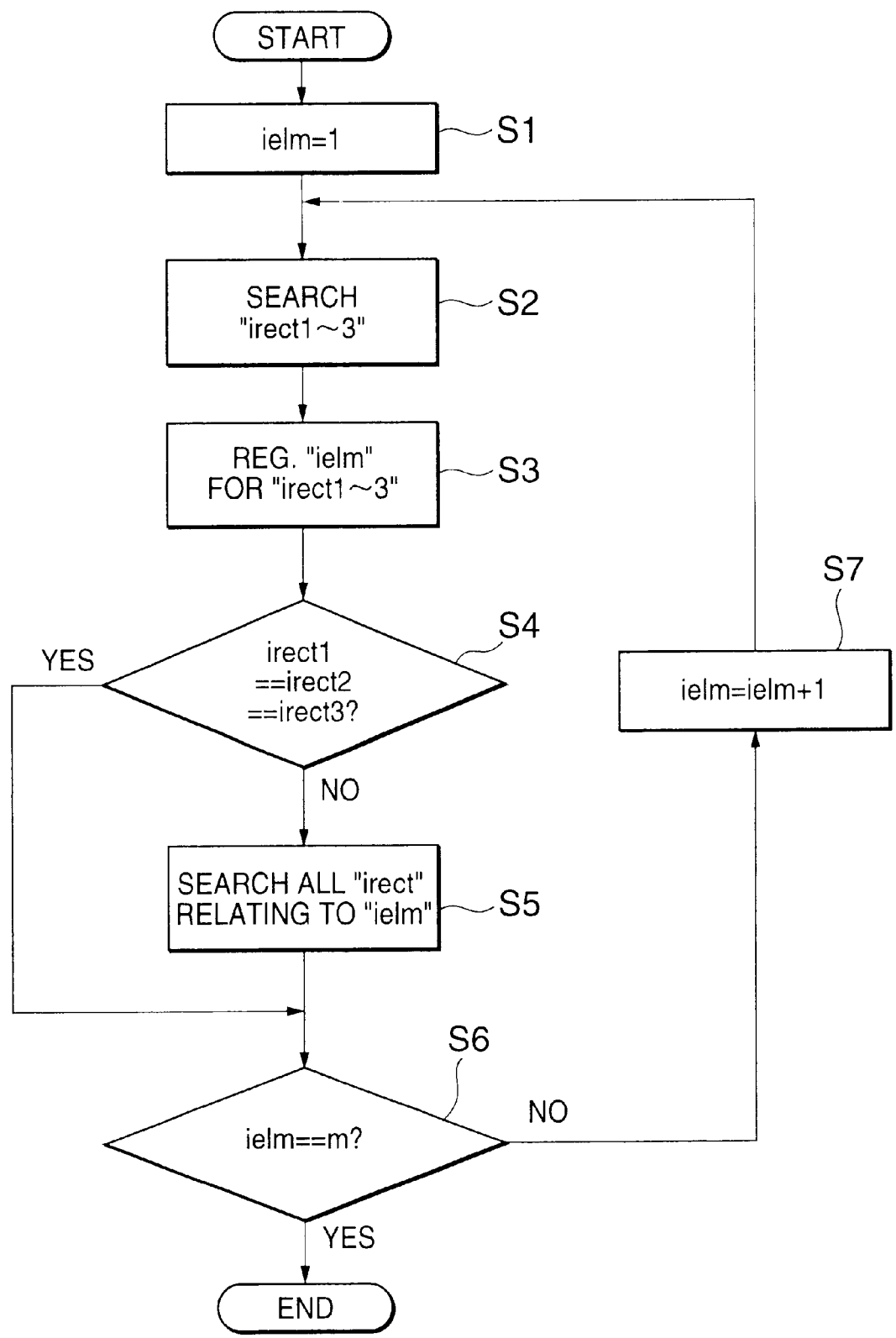
FIG. 3 is a flowchart of a main routine at a reference data table creation method according to the first embodiment of this invention.
Figure 4:
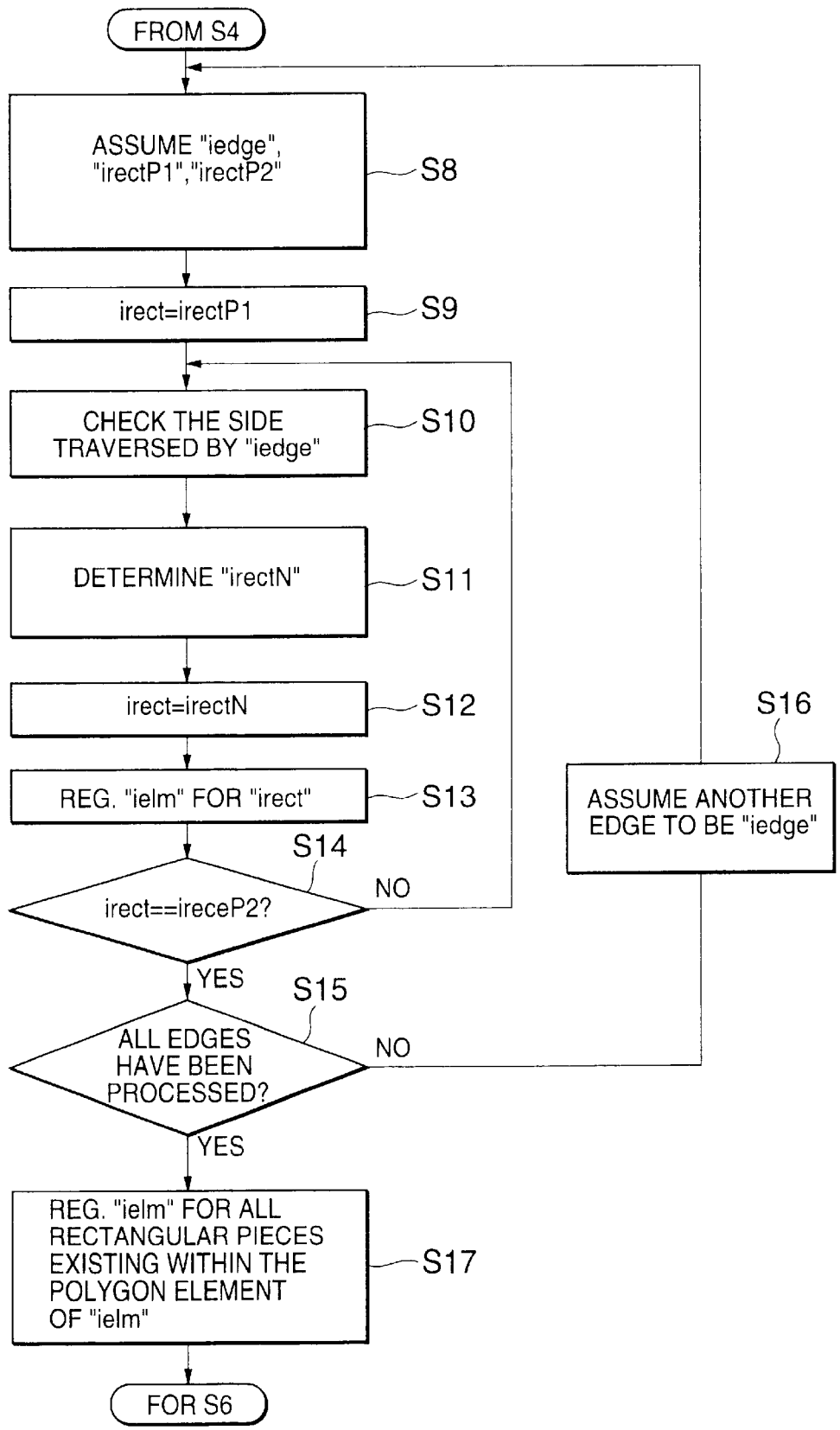
FIG. 4 is a flowchart of a subroutine relating to Step S5 in the main routine illustrated in FIG. 3.

Referring to FIGS. 3 and 4, flowcharts according to this embodiment are shown. FIG. 3 shows a main routine of the reference data table creation according to the present embodiment, while FIG. 4 shows a subroutine relating to Step S5 illustrated in FIG. 3. The steps shown in the flowcharts are stored in a memory in the form of software instructions and, when executed by a processor, causes the processor to perform the reference data table creation method of this embodiment. In advance of carrying out the above-mentioned flowcharts, a simulation object is divided into a plurality of polygon elements. In addition, for each polygon element, the element number and information about locations of vertexes and connections between the vertexes are stored in the memory. In the illustrated flowcharts, the total number of the polygon elements is assumed to be "m" that is an integer.

First, the processor determines a polygon element as a target of registration process. In detail, the processor sets, into a variable "ielm", the element number of the target polygon element. The variable "ielm" represents the target polygon element, and has "1" as an initial value (Step S1).

Then the processor searches rectangular pieces that include the vertexes of the target polygon element (Step S2). In this embodiment, since the shape of the polygon element is triangle, the vertexes of the polygon element are three. Therefore the maximum number of the rectangular pieces to be searched is also three. These rectangular pieces to be searched are represented by three variables "irect1","irect2", and "irect3" in this embodiment. If all of the vertexes of the target polygon element (ielm) are included in one rectangular piece, three variables "irect1", "irect2", and "irect3" indicate the same rectangular piece.

The processor registers the target polygon element for the searched rectangular pieces (Step S3). That is, the processor registers "ielm" for "irect1", "irect2", and "irect3" so that the rows corresponding to "irect1", "irect2", and "irect3" store the element number of the target polygon element of "ielm."

Then the processor judges whether or not all of the three variables "irect1", "irect2", and "irect3" indicate the same rectangular piece (Step S4). That is, the processor judges the following condition is met or not:

irect1==irect2==irect3

If the condition is met, all of the vertexes of the target polygon element (ielm) are included in the same rectangular piece, and therefore, other rectangular pieces relating to the target polygon element do not exist. In this case, the processor stops the registration processes relating to the current target polygon element, and goes to Step S6.

In Step 6, the processor judges whether or not all of the polygon elements have been already processed. In detail, the processor judges whether or not the value of the variable "ielm" is equal to the total number of the polygon elements, "m." If all of the polygon elements has been already processed, the main routine of the creation of the reference data table goes to end. Otherwise, the processor adds "1" to "ielm" (Step S7), and then returns to Step S2. The process loop (S2~S7) is repeated until "ielm" is equal to "m."

If the foregoing condition is not met in Step S4, the target polygon element overlaps plural rectangular pieces. Therefore, the processor carries out the following processes, for the searching all rectangular pieces relating to the target polygon element.

The processor sets an edge of the target polygon element to a variable "iedge." The processor further sets into variables "irectP1" and "irectP2", the rectangular pieces that are connected with two ends of the edge, namely, two vertexes of the target polygon element (Step S8). The rectangular pieces corresponding to the variables "irectP1" and "irectP2" are any two of the rectangular pieces corresponding to the variables "irect1", "irect2", and "irect3" in Step S3.

Herein a new variable "irect" is provided for a rectangular piece that appears in a small loop (S10~S14). The processor substitutes for the variable "irect" the value of "irectP1" specified in Step S8 (Step S9).

The processor checks which side of the rectangular piece "irect" is traversed by the edge "iedge" (Step S10). Then the processor specifies a rectangular piece that shares the traversed side with the rectangular piece corresponding to "irect", and sets the specified rectangular piece to a variable "irectN" (Step S11).

In addition, the processor substitutes "irectN" for "irect" (Step S12). That is, the specified rectangular piece is handled as a new rectangular piece for "irect." The processor registers the target polygon element for the rectangular piece corresponding to "irect." In detail, the processor registers "ielm" for "irect" (Step S13).

Next, the processor judges whether or not the rectangular piece corresponding to "irect" is the rectangular piece corresponding to "irectP2" (Step S14) If the two rectangular pieces are different from each other, the processor returns to Step S10 and repeatedly carries out Steps S10~S14 until the rectangular piece corresponding to "irect" is consistent with the rectangular piece corresponding to "irectP2."

If "irect==irectP2" in Step S14, the processor has registered the target polygon element for all of the rectangular pieces that are traversed by the edge "iedge" of the target polygon element. Therefore the processes relating to the edge are stopped and the processor goes to Step S15. In Step S15, the processor judges whether or not all edges of the target polygon element have been processed. If the processor judges that a yet-processed edge exists, the processor assumes the yet-processed edge to be a new edge corresponding to "iedge" (Step S16), and then, returns to Step S8 to repeat the steps following to Step S8.

If the processor judges that all edges of the target polygon element have been processed in Step S15, the processor has connected the target polygon element with all of the rectangular pieces that are traversed by the edges of the target polygon element. Next, the processor registers the target polygon element for all of the rectangular pieces that are included within the target polygon element (Step S17).

When the processor finishes the process at Step S17, the processor returns to Step S6 and then judges whether or not all of the polygon elements have been already processed. If all of the polygon elements has been already processed, the main routine of the creation of the reference data table goes to end, if not, the processor adds "1" to "ielm" (Step S7), and then returns to Step S2.

Now, a visual description will be made about the above-mentioned method of creating the reference data table according to this embodiment, with further reference to FIGS. 5 to 12, for the sake of further promotion of understanding. In FIGS. 5 to 12, the foregoing variables are connected with the polygon elements (triangle elements) and the rectangular pieces.

Figure 5:
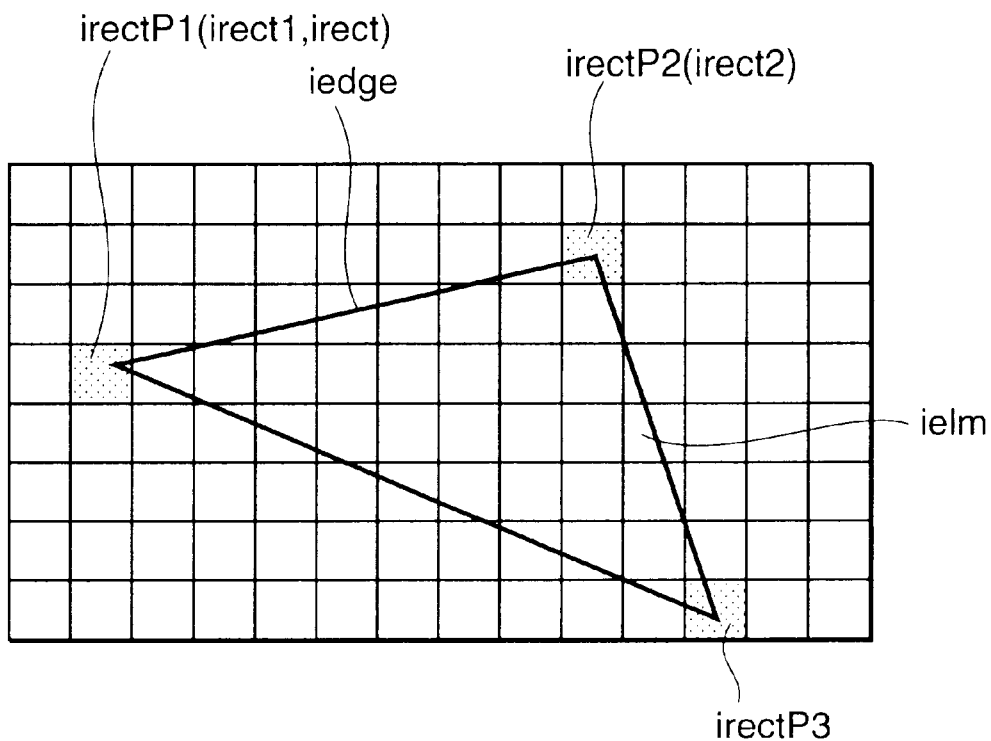
FIG. 5 is a view for use in visual description about the reference data table creation method according to the first embodiment of this invention.

Referring to FIG. 5, in accordance with the target triangle element "ielm", the processor searches the rectangular pieces "irect1", "irect2", and "irect3", which correspond to the vertexes of the target triangle element, respectively (Steps S1 and S2). Then the processor registers the target triangle element "ielm" for the searched rectangular pieces "irect1", "irect2", and "irect3" (Step S3).

In the illustrated example, three vertexes of the target triangle element belong to the rectangular pieces different from each other. Therefore, the processor goes to Step S5, so as to carries out the processes that are for the searching all rectangular pieces relating to the target triangle element (Steps S4, S5 and Steps in FIG. 5).

Then the processor assumes the upper edge of the target triangle element illustrated in FIG. 5 to be the target edge "iedge", and furthermore, assumes the rectangular pieces "irect1" and "irect2" to be the rectangular pieces "irectP1" and "irectP2" (Step S8). In addition, the processor assumes the rectangular piece "irectP1" to be the rectangular piece "irect" (Step S9), and searches the rectangular pieces that are traversed by the edge "iedge", with the rectangular piece "irect" being as a starting point.

Figure 6:
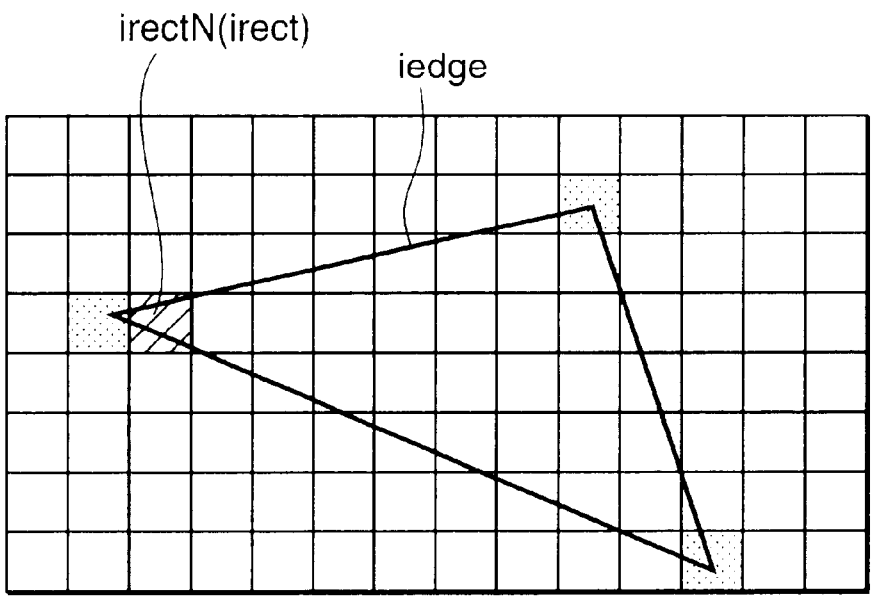
FIG. 6 is another view for use in visual description about the reference data table creation method according to the first embodiment of this invention.

Referring to FIG. 6, the edge "iedge" first traverses the rectangular piece located at right side of the rectangular piece "irectP1" (Step S10), when departing from the rectangular "irectP1." Therefore, the processor specifies the rectangular piece located at right side of the rectangular piece "irectP1", as the specified rectangular piece "irectN" (Step S11).

In addition, the processor substitutes "irectN", for "irect" (Step S12). That is, the specified rectangular piece is handled as a new rectangular piece for "irect." The processor registers the target triangle element "ielm" for the rectangular piece "irect" (Step S13).

The rectangular piece "irect" is different from the rectangular piece "irectP2." Therefore, the processor returns to Step S10 and searches another rectangular piece that is traversed by the edge "iedge."

Figure 7:
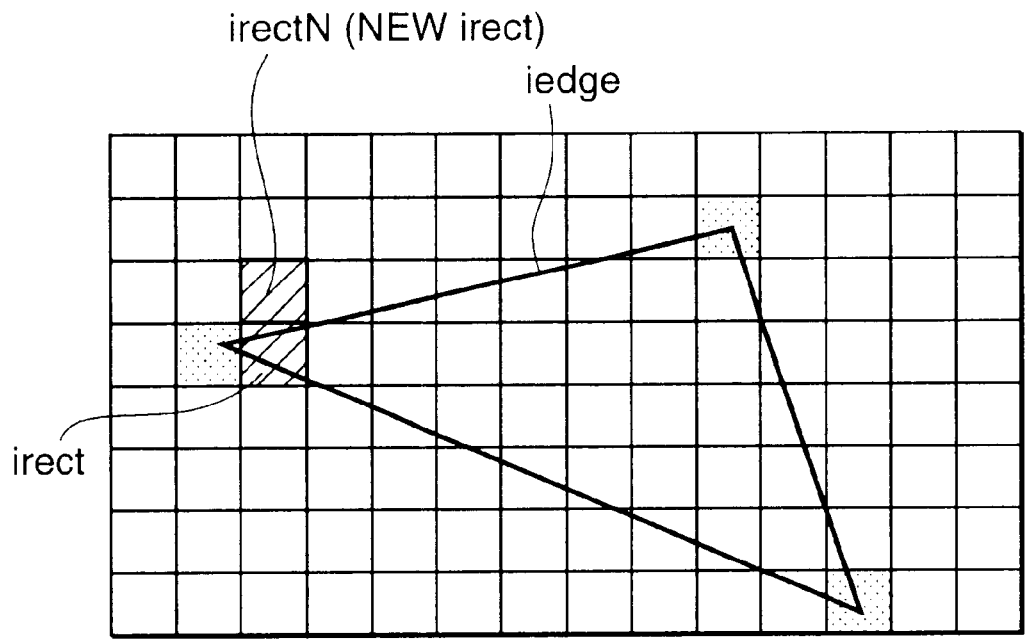
FIG. 7 is another view for use in visual description about the reference data table creation method according to the first embodiment of this invention.

Referring to FIG. 7, when traversing the current rectangular piece "irect", the edge "iedge" then traverses the rectangular piece that locates at upper side of the current rectangular piece "irect" (Step S10). Therefore, the processor assumes the upper rectangular piece of the current rectangular piece "irect" to be a new rectangular piece "irectN" (Step S11).

In addition, the processor substitutes the new rectangular "irectN" for a new rectangular "irect" (Step S12). The processor registers the target triangle element "ielm" for the new rectangular piece "irect" (Step S13).

The new rectangular piece "irect" is different from the rectangular piece "irectP2." Therefore, the processor returns to Step S10, and searches another rectangular piece that is traversed by the edge "iedge."

Figure 8:
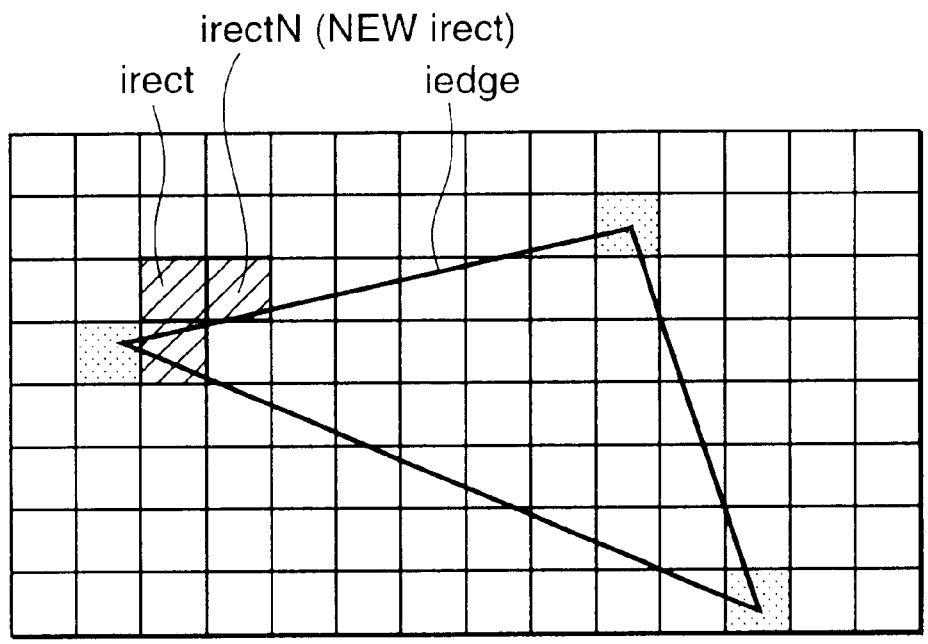
FIG. 8 is another view for use in visual description about the reference data table creation method according to the first embodiment of this invention.
Figure 9:
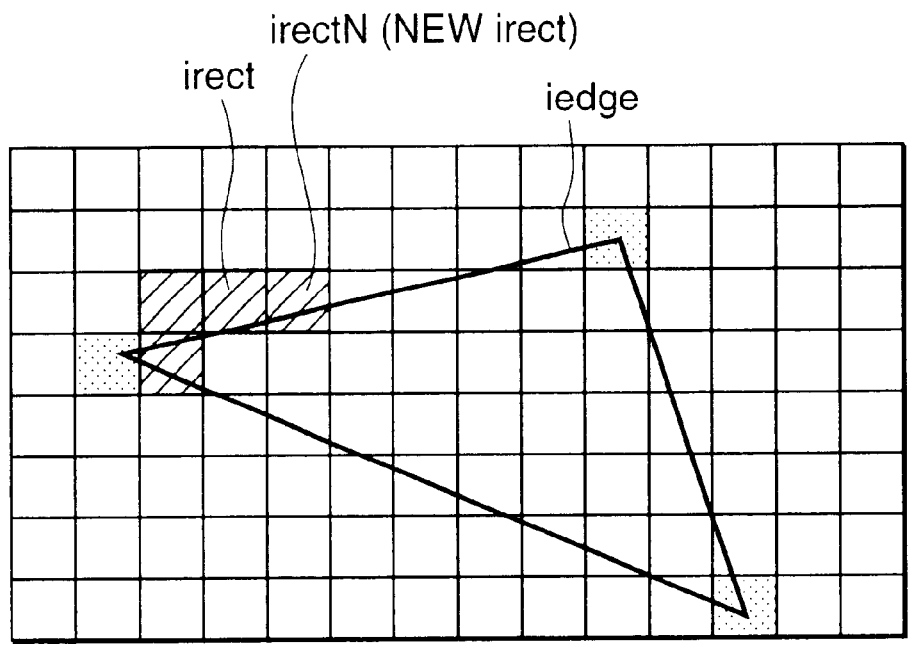
FIG. 9 is another view for use in visual description about the reference data table creation method according to the first embodiment of this invention.

After that, the processor further follows the edge "iedge" and repeats to search other rectangular pieces that are traversed by the edge "iedge", as shown in FIGS. 8 and 9, so as to register the target triangle element "ielm" for the searched rectangular pieces that are traversed by the edge "iedge." As a result, the processor reaches the rectangular piece "irectP2." Thereby, since the rectangular piece "irect"

is consistent with the rectangular piece "irectP2", the processes relating to the current edge "iedge" are stopped (Step S14).

Figure 10:
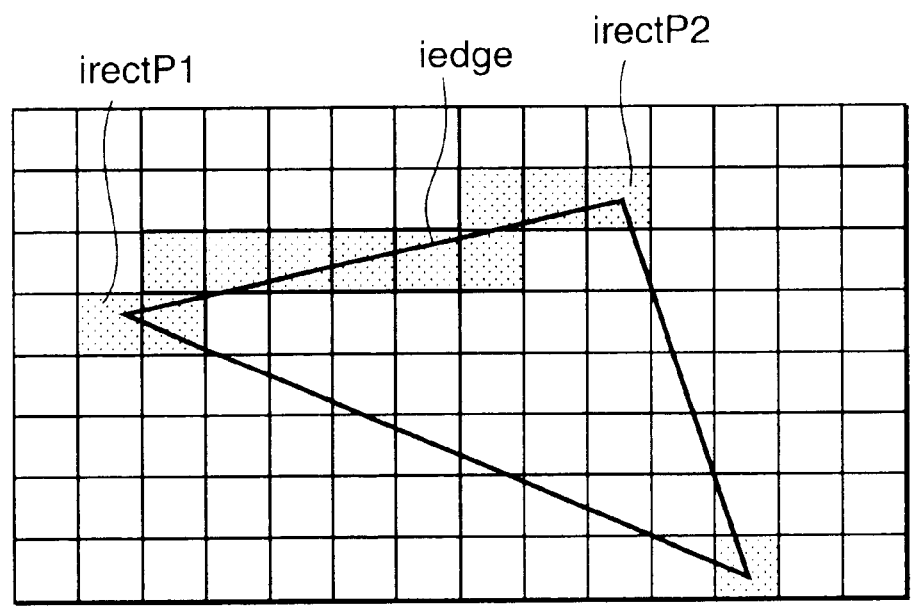
FIG. 10 is another view for use in visual description about the reference data table creation method according to the first embodiment of this invention.

However, as shown in FIG. 10, only one edge of the target triangle element "ielm" has been processed at this time (Step S15). Therefore, the processor assumes another yet-processed edge to be a new edge corresponding to "iedge" (Step S16), and then, returns to Step S8 to repeat the steps following to Step S8.

Figure 11:
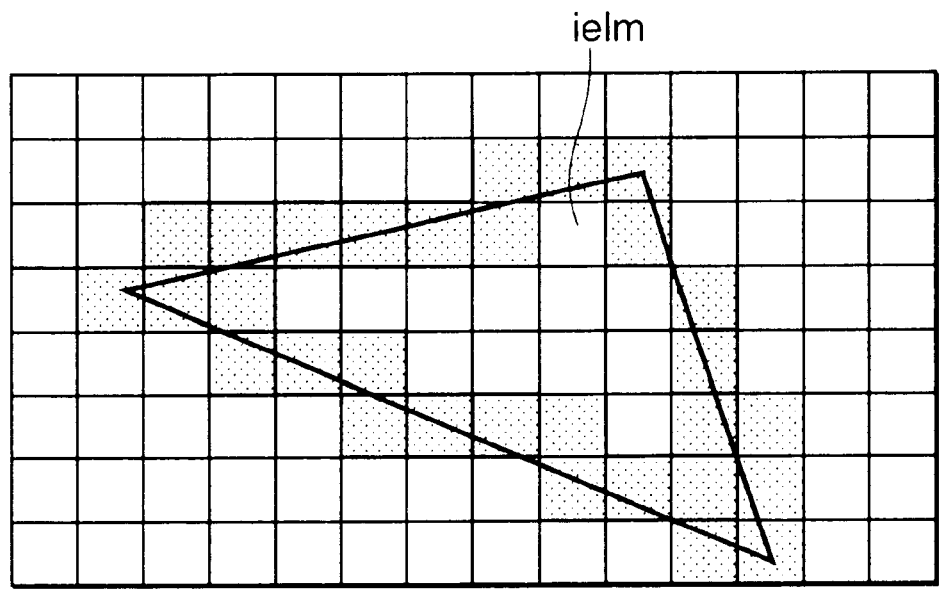
FIG. 11 is another view for use in visual description about the reference data table creation method according to the first embodiment of this invention.

The repetition of the process loop S8~S16 brings about the result as shown in FIG. 11. In FIG. 11, the target triangle element "ielm" has been registered with the marked rectangular pieces. Among the rectangular pieces that overlap the target triangle element "ielm", the rectangular pieces that target triangle element "ielm" has not been registered with are the rectangular pieces that exist within the target triangle element "ielm." Therefore, the processor registers the target triangle element "ielm" for all of the rectangular pieces that exist within the target triangle element "ielm" (Step S17).

Herein, the exemplary processes at Step S17 are mentioned.

First, the processor assumes a group of the rectangular pieces that are circumscribed on the target triangle element "ielm." For example, the processor may assume a larger rectangular piece that is obtained by combining the rectangular pieces and that has minimum size among the obtainable larger rectangular pieces. The processor further creates a data table for the group of the rectangular pieces circumscribed on the target triangle element "ielm."

An orthogonal mesh at the group of the rectangular pieces is similar to the foregoing orthogonal mesh, except for piece size. Therefore, based on the foregoing rectangular pieces "irect1", "irect2", and "irect3" the processor can define minimum and maximum indexes "idx_min" and "idx_max" in the X-direction, and minimum and maximum indexes "idy_min" and "idy_max" in the Y-direction.

After the definition, the target triangle element "ielm" is included in an area defined by the indexes "idx_min"~"idx_max" and "idy_min"~"idy_max." Therefore, the processor carries out a loop process while i=idx_min~idx_max and j=idy_min~idy_max, "i" and "j" being variables, and thereby, searches the rectangular pieces that the target triangle element has been registered with. As the result of searching, the processor can find out all of the rectangular pieces that exist within the target triangle element "ielm."

Figure 12:
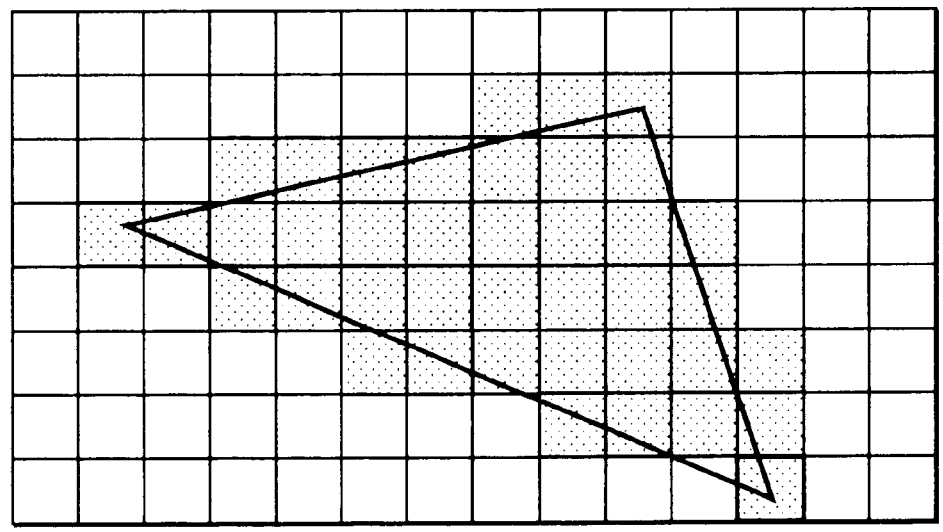
FIG. 12 is another view for use in visual description about the reference data table creation method according to the first embodiment of this invention.

Thus, the processor registers the target triangle element "ielm" for all of the rectangular pieces that overlap the target triangle element "ielm", as shown in FIG. 12.

In the foregoing Step S10, the processor checks which side of the rectangular piece "irect" is traversed by the edge "iedge." However, there is a case where the edge "iedge" does not traverse a side of the rectangular piece "irect" but a vertex of the rectangular piece "irect." In this case, the processor specifies, as the above-mentioned checked sides, the sides that are connected with the vertex traversed by the edge "iedge", and carries out the above-mentioned processing.

The above-mentioned method of creating the reference data table can be applied, for example, for the field of the device process simulations. In this case, the object shown in FIG. 1 is a cross-sectional structure of the device to be on-implanted. For example, Y-direction is a direction vertical to the surface of the semiconductor substrate. X- and Y-directions may be an ion-implantation direction and a direction vertical to the ion-implantation direction. Also, the method of creating the reference data table can be applied, for example, for an analysis of the automobile structure in view of hydrodynamics. In this case, an outward form of the automobile is abstracted into a simulation mode, and the modeled form is further divided into a plurality of elements as mentioned above.

The elements illustrated in FIGS. 5 to 12 are triangle, but this invention is not limited to the triangle element. Elements may have other shapes, for example, pentagonal shapes or octagonal shapes.

Figure 13:
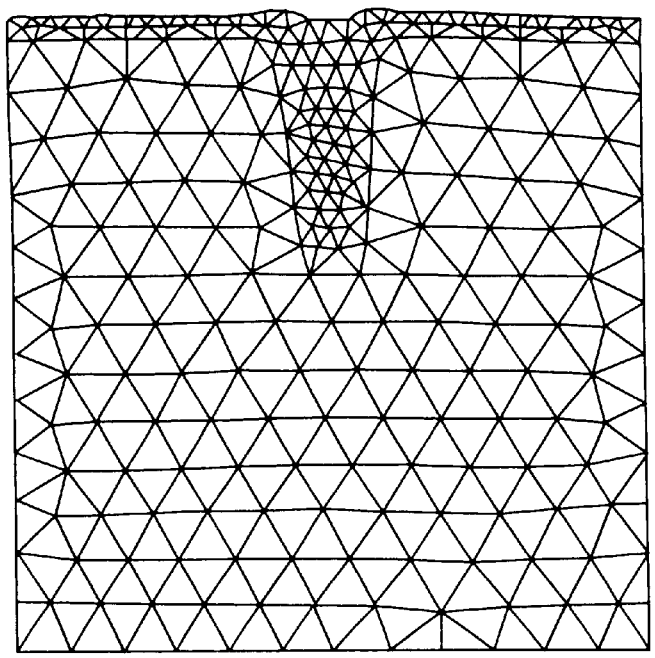
FIG. 13 is a view for use in description about a modification of the reference data table creation method according to the first embodiment of this invention.
Figure 14:
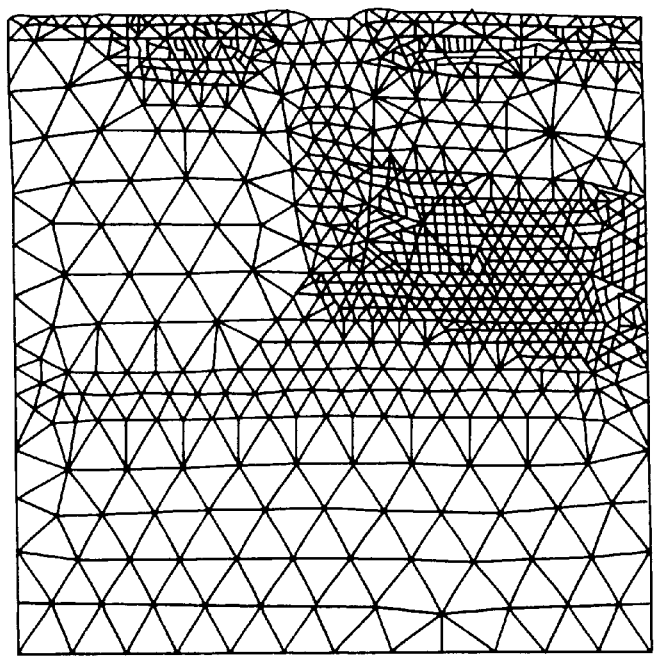
FIG. 14 is another view for use in description about a modification of the reference data table creation method according to the first embodiment of this invention.

The rectangular pieces illustrated in FIGS. 5 to 12 have the same size, but this invention is not limited thereto. For example, the rectangular pieces may locally have larger or smaller size than that of other pieces. Furthermore, the rectangular piece size may locally have larger or smaller as time passed and in correspondence with required analysis. For example, if the object is initially divided into the elements as shown in FIG. 13, the divided profile is changed into that illustrated in FIG. 14, corresponding to the part giving great effect on the analysis. Varying size of elements is described, for example, in "Iterative Method in Semiconductor Device Simulation" IEEE TRANSACTIONS ON ELECTRON DEVICES, VOL. ED-32, No. 10, October 1985, which is incorporated herein by reference.

In relation, the sizes of the rectangular pieces may be selected in correspondence with the sizes of the polygon elements. That is, if the size of the polygon element is larger than other polygon elements, the corresponding rectangular piece is selected to be large, if the size of the polygon element is smaller than other polygon elements, the corresponding rectangular piece is selected to be small.

A second embodiment of the present invention is a modification or an extension of the foregoing first embodiment, which can handle the three-dimensional object and can provide a method of creating a reference data table where polyhedron elements and rectangular blocks are connected with each other. In this embodiment, a three-dimensional orthogonal coordinates is configured to cover the three-dimensional object, and the rectangular blocks are regularly arranged with in the three dimensional orthogonal coordinates. Each of the polyhedron elements is assigned with a unique number as a element number, while each of the rectangular blocks is assigned with a unique number as a block number. The block numbers are registered with the respective rows of left column, as the same manner of the first embodiment. For example, the reference data table for the three-dimensional object is used for a three-dimensional simulation where the three-dimensional effect of the device is computed or the automobile structure is analyzed in view of hydrodynamics. Herein, tetrahedron elements are used as the polyhedron elements in this embodiment.

Figure 15:
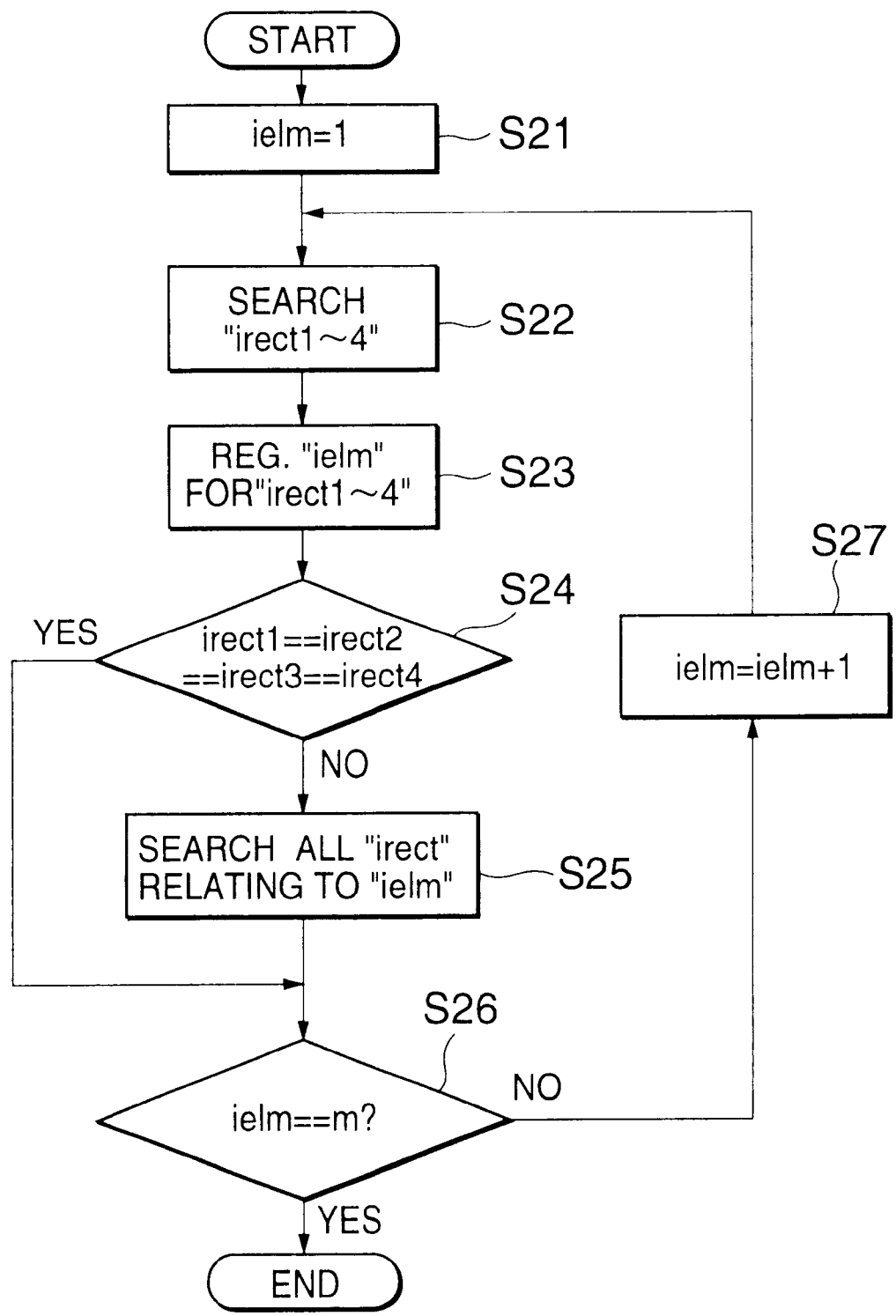
FIG. 15 is a flowchart of a main routine at a reference data table creation method according to a second embodiment of this invention.
Figure 16:
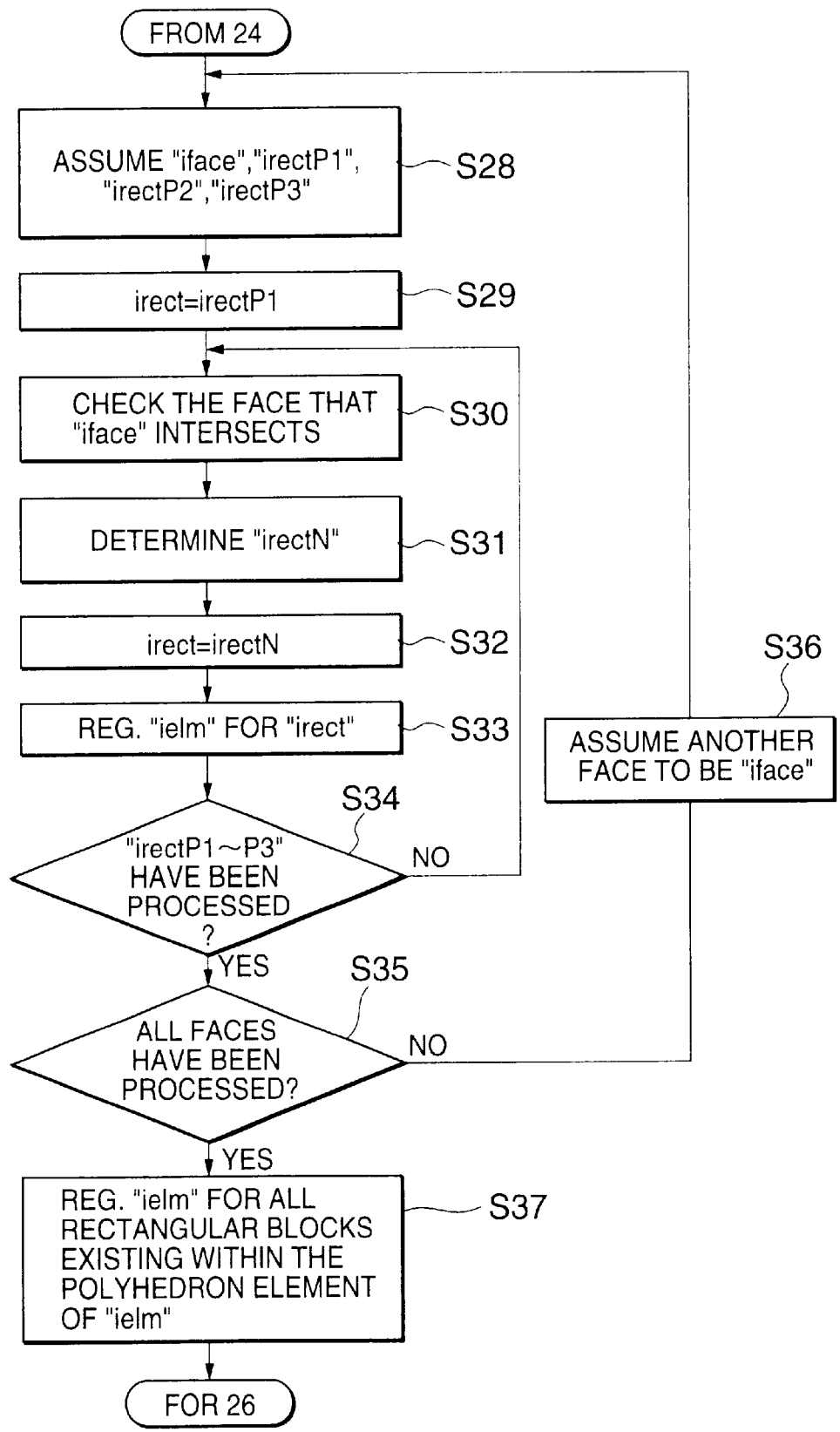
FIG. 16 is a flowchart of a subroutine relating to Step S25 in the main routine illustrated in FIG. 15.

Referring to FIGS. 15 and 16, flowcharts according to the second embodiment of this invention are shown. FIG. 15 shows a main routine of the reference data table creation according to this embodiment, while FIG. 16 shows a subroutine relating to Step S25 illustrated in FIG. 15. The steps shown in the flowcharts are stored in a memory in the form of software instructions and, when executed by a processor, causes the processor to perform the reference data table creation method of this embodiment. In advance of carrying out the above-mentioned flowcharts, a simulation object is divided into a plurality of polyhedron elements. In addition, for each polyhedron element, information about locations of vertexes and faces where the vertexes belong is stored in the memory. In the illustrated flowcharts, the total number of the polyhedron elements is assumed to be "m" that is an integer.

First, the processor determines a polyhedron element as a target of registration process. In detail, the processor sets, into a variable "ielm", the element number of the target polyhedron element. The variable "ielm" represents the target polyhedron element, and has "1" as an initial value (Step S21).

Then the processor searches rectangular blocks that include the vertexes of the target polyhedron element (Step S22). In this embodiment, since the shape of the polyhedron element is tetrahedron, the vertexes of the polyhedron element are four. Therefore the maximum number of the rectangular blocks to be searched is also four. These rectangular blocks to be searched are represented by four variables "irect1", "irect2", "irect3", and "irect4" in this embodiment. If all of the vertexes of the target polyhedron element (ielm) are included in one rectangular block, four variables "irect1", "irect2", "irect3", and "irect4" indicate the same rectangular block.

The processor registers the target polyhedron element for the searched rectangular blocks (Step S23). That is, the processor registers "ielm" for "irect1", "irect2", "irect3", and "irect4" so that the rows corresponding to "irect1", "irect2", "irect3", and "irect4" store the element number of the target polyhedron element of "ielm."

Then the processor judges whether or not all of the variables "irect1", "irect2", "irect3", and "irect4" indicate the same rectangular block (Step S24). That is, the processor judges the following condition is met or not:

irect1==irect2==irect3==irect4

If the condition is met, all of the vertexes of the target polyhedron element (ielm) are included in the same rectangular block, and therefore, other rectangular blocks relating to the target polyhedron element do not exist. In this case, the processor stops the registration processes relating to the current target polyhedron element, and goes to Step S26.

In Step 26, the processor judges whether or not all of the polyhedron elements have been already processed, In detail, the processor judges whether or not the value of the variable "ielm" is equal to the total number of the polyhedron elements, "m." If all of the polyhedron elements has been already processed, the main routine of the creation of the reference data table goes to end. Otherwise, the processor adds "1" to "ielm" (Step S27), and then returns to Step S22. The process loop (S22~S27) is repeated until "ielm" is equal to "m."

If the foregoing condition is not met in Step S24, the target polyhedron element overlaps plural rectangular blocks. Therefore, the processor carries out the following processes, for the searching all rectangular blocks relating to the target polyhedron element.

The processor sets a face of the target polyhedron element to a variable "iface." The processor further sets, into variables "irectP1", "irectP2", and "irectP3", the rectangular blocks that are connected with three vertexes of the face (Step S28). The rectangular blocks corresponding to the variables "irectP1", "irectP2", "irectP3" are any three of the rectangular blocks corresponding to the variables "irect1", "irect2", "irect3", "irect4" in Step S23.

Herein a new variable "irect" is provided for a rectangular block that appears in a small loop (S30~S34). The processor substitutes for the variable "irect" the value of "irectP1" specified in Step S28 (Step S29).

The processor checks which face of the rectangular block "irect" intersects the face "iface" (Step S30). Then the processor specifies a rectangular block that shares the intersecting face with the rectangular block corresponding to "irect", and sets the specified rectangular block to a variable "irectN" (Step S31).

In addition, the processor substitutes "irectN" for "irect" (Step S32). That is, the specified rectangular block is handled as a new rectangular block for "irect." The processor registers the target polyhedron element for the rectangular block corresponding to "irect." In detail, the processor registers "ielm" for "irect" (Step S33).

Next, the processor judges whether or not all of the rectangular blocks "irectP1"~"irectP3" have been processed (Step S34). If all of the rectangular blocks "irectP1"~"irectP3" have not been processed yet, the processor returns to Step S30 and repeatedly carries out Steps S30~S34 until all of the rectangular blocks "irectP1"~"irectP3" have been processed.

If all of the rectangular blocks "irectP1"~"irectP3" have been processed in Step S34, the processor has registered the target polyhedron element for all of the rectangular blocks that intersect the current face "iface" of the target polyhedron element. Therefore the processes relating to the current face are stopped and the processor goes to Step S35. In Step S35, the processor judges whether or not all faces of the target polyhedron element have been processed. If the processor judges that a yet-processed face exists, the processor assumes the yet-processed face to be a new face "iface" (Step S36), and then, returns to Step S28 to repeat the steps following to Step S28.

If the processor judges that all edges of the target polyhedron element have been processed in Step S35, the processor has connected the target polyhedron element with all of the rectangular blocks that intersect the faces of the target polyhedron element. Next, the processor registers the target polyhedron element for all of the rectangular blocks that are included within the target polyhedron element (Step S37).

When the processor finishes the process at Step S37, the processor returns to Step S26 and then judges whether or not all of the polyhedron elements have been already processed. If all of the polyhedron elements has been already processed, the main routine of the creation of the reference data table goes to end, if not, the processor adds "1" to "ielm" (Step S27), and then returns to Step S22.

The aforementioned method of creating the reference data table can be applied, for example, for the field of the device process simulations, or for an analysis of the automobile structure in view of hydrodynamics, similarly to the first embodiment.

The elements mentioned above are tetrahedron, but this invention is not limited to the tetrahedral element, Elements may have other shapes, for example, triangular prisms, rectangular blocks, or pyramidal shapes.

In addition, the rectangular blocks may locally have larger or smaller size than that of other blocks. In detail, the sizes of the rectangular blocks may be selected in correspondence with the sizes of the polyhedron elements. That is, if the size of the polyhedron element is larger than other polyhedron elements, the corresponding rectangular block is selected to be large, if the size of the polyhedron element is smaller than other polyhedron elements, the corresponding rectangular block is selected to be small.

While the invention has been particularly shown and described with respect to preferred embodiments thereof it will be understood by those skilled in the art that changes in form and details may be made therein without departing from the scope and spirit of the invention.

What is claimed is:

1. A method for creating a reference data table, comprising:
    defining two-dimensional rectangular coordinates to cover a two-dimensional object;
    dividing the two-dimensional object into a plurality of polygon elements each of which has vertexes and edges connecting between two vertexes, and each of which has, as a element number, a unique number added to the polygon element;

producing a two-dimensional orthogonal mesh on the two-dimensional rectangular coordinates, the two-dimensional orthogonal mesh comprising a plurality of rectangular pieces which are regularly arranged on the two-dimensional rectangular coordinates and each of which has, as a piece number, a unique number added to the rectangular piece;

making an initial data table having two column and a plurality of rows, each of rows at one column storing the piece numbers of the rectangular pieces, respectively; and carrying out a predetermined registration process for each of the polygon element as a target polygon element so that, when the predetermined registration process is repeatedly carried out for all of the polygon element, the reference data table is obtained; wherein the predetermined registration process comprising:

searching, as first searched rectangular pieces, the rectangular pieces that include the vertexes of the target polygon element, so as to register the element number of the target polygon element for the rows corresponding to the first searched rectangular pieces;

searching, as second searched rectangular pieces, the rectangular pieces that are traversed by the edges of the target polygon element, so as to register the element number of the target polygon element for the rows corresponding to the second searched rectangular pieces; and registering the element number of the target polygon element for the rows corresponding to the rectangular pieces that exist within the target polygon element, so that the element number of the target polygon element is registered with all of the rectangular pieces overlapping the target polygon element.

2. A creating method as claimed in claim 1, wherein each of the polygon elements has triangular shape.

3. A creating method as claimed in claim 1, wherein:
the two-dimensional object is a cross-sectional structure of the device to be ion-implanted in an ion-implantation simulation;
the reference data table is used in the ion-implantation simulation to compute the polygon element an implanted-ion reaches.

4. A creating method as claimed in claim 3, wherein:
the two-dimensional rectangular coordinates consists of a first coordinate axis and a second coordinate axis which are at right angels to each other; and
the first coordinate axis is a direction vertical to a surface of a semiconductor substrate to be ion-implanted.

5. A creating method as claimed in claim 3, wherein:
the two-dimensional rectangular coordinates consists of a first coordinate axis and a second coordinate axis which are at right angels to each other; and
the first coordinate axis is an ion-implantation direction.

6. A computer program comprising software instructions which, when executed by a processor, causes the processor to perform predetermined operations for creating a reference data table, the predetermined operations including:

defining two-dimensional rectangular coordinates to cover a two-dimensional object;

dividing the two-dimensional object into a plurality of polygon elements each of which has vertexes and edges connecting between two vertexes, and each of which has, as a element number, a unique number added to the polygon element;

producing a two-dimensional orthogonal mesh on the two-dimensional rectangular coordinates, the two-dimensional orthogonal mesh comprising a plurality of rectangular pieces which are regularly arranged on the two-dimensional rectangular coordinates and each of which has, as a piece number, a unique number added to the rectangular piece;

making an initial data table having two column and a plurality of rows, each of rows at one column storing the piece numbers of the rectangular pieces, respectively; and carrying out a predetermined registration process for each of the polygon element as a target polygon element so that, when the predetermined registration process is repeatedly carried out for all of the polygon element, the reference data table is obtained; wherein the predetermined registration process comprising:

searching, as first searched rectangular pieces, the rectangular pieces that include the vertexes of the target polygon element, so as to register the element number of the target polygon element for the rows corresponding to the first searched rectangular pieces;

searching, as second searched rectangular pieces, the rectangular pieces that are traversed by the edges of the target polygon element, so as to register the element number of the target polygon element for the rows corresponding to the second searched rectangular pieces; and registering the element number of the target polygon element for the rows corresponding to the rectangular pieces that exist within the target polygon element, so that the element number of the target polygon element is registered with all of the rectangular pieces overlapping the target polygon element.

7. A method for creating a reference data table, comprising:

defining three-dimensional rectangular coordinates to cover a three-dimensional object;

dividing the three-dimensional object into a plurality of polyhedron elements each of which has vertexes and faces where the vertexes belong, each of polyhedron elements having, as a element number, a unique number added to the polyhedron elements;

producing a three-dimensional orthogonal mesh on the three-dimensional rectangular coordinates, the three-dimensional orthogonal mesh comprising a plurality of rectangular blocks which are regularly arranged within the three-dimensional rectangular coordinates and each of which has, as a block number, a unique number added to the rectangular block;

making an initial data table having two column and a plurality of rows, each of rows at one column storing the block numbers of the rectangular blocks, respectively; and carrying out a predetermined registration process for each of the polyhedron element as a target polyhedron element so that, when the predetermined registration process is repeatedly carried out for all of the polyhedron element, the reference data table is obtained;

wherein the predetermined registration process comprising:

searching, as first searched rectangular blocks, the rectangular blocks that include the vertexes of the target polyhedron element, so as to register the element number of the target polyhedron element for the rows corresponding to the first searched rectangular blocks;

searching, as second searched rectangular blocks, the rectangular blocks that intersect the faces of the target polyhedron element, so as to register the element number of the target polyhedron element for the rows corresponding to the second searched rectangular blocks; and registering the element number of the target polyhedron element for the rows corresponding to the rectangular blocks that exist within the target polyhedron element, so that the element number of the target polyhedron element is registered with all of the rectangular blocks overlapping the target polyhedron element.

8. A creating method as claimed in claim 7, wherein each of the polyhedron elements has tetrahedral shape.

9. A creating method as claimed in claim 7, wherein:

the three-dimensional object is a structure of a device to be ion-implanted in an ion-implantation simulation;

the reference data table is used in the ion-implantation simulation to compute the polyhedron element an implanted-ion reaches.

10. A creating method as claimed in claim 9, wherein:

the three-dimensional rectangular coordinates consists of first to third coordinate axes which are perpendicular to each other; and the first coordinate axis is a direction vertical to a surface of a semiconductor substrate to be ion-implanted.

11. A creating method as claimed in claim 9, wherein:

the three-dimensional rectangular coordinates consists of first to third coordinate axes which are perpendicular to each other; and the first coordinate axis is an ion-implantation direction.

12. A computer program comprising software instructions which, when executed by a processor, causes the processor to perform predetermined operations for creating a reference data table, the predetermined operations including:

defining three-dimensional rectangular coordinates to cover a three-dimensional object;

dividing the three-dimensional object into a plurality of polyhedron elements each of which has vertexes and faces where the vertexes belong, each of the polyhedron elements having, as a element number, a unique number added to the polyhedron element;

producing a three-dimensional orthogonal mesh on the three-dimensional rectangular coordinates, the three-dimensional orthogonal mesh comprising a plurality of rectangular blocks which are regularly arranged within the three-dimensional rectangular coordinates and each of which has, as a block number, a unique number added to the rectangular block;

making an initial data table having two column and a plurality of rows, each of rows at one column storing the block numbers of the rectangular blocks, respectively; and carrying out a predetermined registration process for each of the polyhedron element as a target polyhedron element so that, when the predetermined registration process is repeatedly carried out for all of the polyhedron element, the reference data table is obtained;

wherein the predetermined registration process comprising:

searching, as first searched rectangular blocks, the rectangular blocks that include the vertexes of the target polyhedron element, so as to register the element number of the target polyhedron element for the rows corresponding to the first searched rectangular blocks;

searching, as second searched rectangular blocks, the rectangular blocks that intersect the faces of the target polyhedron element, so as to register the element number of the target polyhedron element for the rows corresponding to the second searched rectangular blocks; and registering the element number of the target polyhedron element for the rows corresponding to the rectangular blocks that exist within the target polyhedron element, so that the element number of the target polyhedron element is registered with all of the rectangular blocks overlapping the target polyhedron element.

* * * * *